United States Patent [19]

Ohta et al.

[11] Patent Number: 5,441,571
[45] Date of Patent: Aug. 15, 1995

[54] CYLINDRICAL APPARATUS FOR GROWTH OF EPITAXIAL LAYERS

[75] Inventors: Yutaka Ohta; Yusho Hoshina; Takeshi Arai, all of Gunma, Japan

[73] Assignee: Shin-Etsu Handotai Co., Ltd., Tokyo, Japan

[21] Appl. No.: 127,729

[22] Filed: Sep. 28, 1993

[30] Foreign Application Priority Data

Sep. 28, 1992 [JP] Japan .................. 4-282552

[51] Int. Cl.⁶ .............................................. C23C 16/00
[52] U.S. Cl. ...................................... 118/730; 118/729
[58] Field of Search ............... 118/725, 726, 728, 729, 118/730

[56] References Cited

U.S. PATENT DOCUMENTS

| | | | |
|---|---|---|---|
| 3,637,434 | 1/1972 | Nakanuma et al. | 118/725 |
| 4,422,407 | 12/1983 | Bessot et al. | 118/728 |
| 4,612,207 | 9/1986 | Jansen | 118/725 |
| 4,638,762 | 1/1987 | Kim et al. | 118/725 |
| 4,728,389 | 3/1988 | Logar | 156/612 |
| 4,976,216 | 12/1990 | Maeda et al. | 118/728 |
| 5,002,011 | 3/1991 | Ohmine et al. | 118/725 |
| 5,053,247 | 10/1991 | Moore | 118/728 |

FOREIGN PATENT DOCUMENTS 56-113981 5/1979 Japan .
60-215594 6/1984 Japan .

*Primary Examiner*—Olik Chaudhuri
*Assistant Examiner*—Brian K. Dutton
*Attorney, Agent, or Firm*—Ronald R. Snider

[57] ABSTRACT

A cylindrical apparatus for the growth of epitaxial layers having disposed inside a bell jar a susceptor provided thereon with pockets for retaining a substrate is disclosed. It allows the flow rate of a raw material gas inside the apparatus to be uniformized, the fluctuation of film thickness of epitaxial layers within one batch to be repressed below 5%, and the fluctuation of film thickness of an epitaxial layer in the substrate to be decreased by equalizing the gap area between the peripheral surface of the susceptor and the internal wall surface of the bell jar at least in the lateral wall portions of the bell jar confronting the substrates on the susceptor.

2 Claims, 6 Drawing Sheets

Prior Art

Prior Art

CYLINDRICAL APPARATUS FOR GROWTH OF EPITAXIAL LAYERS

BACKGROUND OF THE INVENTION

1. Field of the Invention

This invention relates to the construction of a bell jar in a cylindrical apparatus for the growth of epitaxial layers.

2. Description of the Prior Art

The cylindrical apparatus for the growth of epitaxial layers has such a construction as illustrated in FIG. 7. Specifically, it comprises a bell jar 21 made of quartz, a susceptor 22 disposed rotatably inside the bell jar 21, circularly depressed pockets 23 formed on the lateral wall surfaces of the susceptor 22, and a heater 24 surrounding the peripheral surface of the bell jar 21 and, by a procedure which consists of charging the pockets 23 each with a substrate (not shown) like a silicon single crystal substrate, causing the heater 24 to heat the susceptor 22 and the substrates through the bell jar 21, and keeping the susceptor 22 in rotation and meantime causing a raw material gas 25 for epitaxial growth to flow down the interior of the bell jar 21, effects growth of epitaxial layers one each on the substrates.

In the lateral wall portions R of the bell jar 21 that confront the substrates on the susceptor 22 in the apparatus for epitaxial growth described above, the bell jar 2 assumes the shape of an erect cylinder and the susceptor 22 assumes the shape of a prismoid (enclosed laterally with trapezoids) having a lower base surface larger than the upper base surface so as to retain the substrates fast in place. As illustrated in FIG. 9, therefore, the gap area between the peripheral surface 22a of the susceptor 22 and the internal wall surface 21a of the bell jar 21 (the area enclosed with the polygon forming the periphery of the susceptor and the circle forming the internal wall of the bell jar) increases upwardly and decreases downwardly in the lateral wall portions R of the bell jar. Incidentally, when the cylindrical apparatus for the growth of epitaxial layers is used to obtain growth of epitaxial layers one each on the substrates set in place therein, the distribution of film thickness of each substrate within the surface thereof is generally determined with the maximum and minimum values of film thickness found at a total of five points, i.e. the central point ① plus the four points taken in the peripheral region of a given substrate 31 as illustrated in FIG. 8 [through the measurement with a Fourier transform infrared spectrophotometer (hereinafter referred to as "FTIR")]. The expression "four points in the peripheral region" as used herein refers to the four points ②, ③, ④, and ⑤ taken as regularly spaced circumferentially on a concentric curve C located at a distance of 5 mm from the contour of the substrate indicated by a broken line in FIG. 8. These points are so fixed that the point ④ will fall directly below the central point of an orientation flat part 31a and the straight line connecting the points ④ and ② and the straight line connecting the points ③ and ⑤ will perpendicularly intersect each other.

Only naturally, the maximum values and minimum values of film thickness of a given epitaxial substrate at the five points mentioned above are desired to be as close to each other as possible. When the film thickness of an epitaxial layer on a substrate in the cylindrical apparatus for the growth of epitaxial layers is discussed, the distribution of film thickness in the direction of rotation of the susceptor raises a problem more often rather than the distribution in the direction of the major axis of the susceptor. When the substrate 31 is set in place with the orientation flat part 31a thereof held on the upper side as illustrated in FIG. 8, it is necessary to control the film thickness particularly at the points ⑤, ①, and ③.

For the sake of this control, the dishing ratio D which is defined by the following formula 1 is adopted at times if not always as a criterion of control. Naturally, this dishing ratio D is desired to be as close to 1 as possible.

Formula 1

$$D = (a+b)/2c$$

[wherein a stands for the film thickness at the point ⑤, b for the film thickness at the point ③, and c for the film thickness at the point ①].

Incidentally, it has been known that in the cylindrical apparatus for the growth of epitaxial layers which is provided with a three pocket susceptor 22 (capable of accommodating three substrates at the upper, middle, and lower levels on one trapezoidal side) such as is illustrated in FIG. 7, the dishing ratio in the substrate at a given level decreases in proportion as the flow rate of a raw material gas 25 flowing inside the bell jar 21 increases. The means of control heretofore employed for the purpose of uniformizing the distribution of film thickness of all the epitaxial layers being grown in one batch of epitaxial layer growth has been limited to the practice of setting the flow rate of raw material gas so that the dishing ratio of the substrates held in the middle pockets of the susceptor 22 will be 1.

Generally, the dishing ratio varies in the upper, middle, and lower levels of the susceptor; it decreases toward the upper level and increases toward the lower level along the height of the susceptor. This fact is responsible for the phenomenon that the silicon epitaxial layer gains in thickness in the central part of the substrate in the upper level as compared with the outer peripheral part thereof and, conversely in the lower level, the silicon epitaxial layer loses thickness in the central part as compared with the outer peripheral part. As a result, the epitaxial layers grown in one batch have the largest thickness in the central parts of the substrates in the upper level and to the contrary the smallest thickness in the central parts of the substrates in the lower level. Not infrequently, the distribution of film thickness in one batch which is defined by the following formula 2 surpasses 8%.

Formula 2

Fluctuation of film thickness in one batch (%) $= (Ta - Tb) \times 100/(Ta + Tb)$ [wherein Ta stands for the maximum and Tb for the minimum of all the values of film thickness found at the prescribed points of measurement in one batch].

Further, the cylindrical apparatus for the growth of epitaxial layers is at a disadvantage in having a large value for the fluctuation of film thickness within a substrate (fluctuation of thickness of an epitaxial layer within the surface thereof) which is defined by the following formula 3.

Formula 3

Fluctuation of film thickness in one substrate (%) $= (Tm - Tn) \times 100/(Tm + Tn)$

[wherein Tm stands for the maximum and Tn for the minimum of all the values of film thickness found at the prescribed points of measurement within the substrate].

The fluctuation of film thickness in the batch and the fluctuation of film thickness in the substrate mentioned above are to be determined by the method of five-point measurement (FIG. 8) described above.

SUMMARY OF THE INVENTION

As is plain from the description given thus far, the task imposed on this invention consists in notably decreasing the fluctuation of film thickness in the batch and the fluctuation of film thickness in the substrate mentioned above in such a cylindrical apparatus for the growth of epitaxial layers as is illustrated in FIG. 7 as compared with those obtained in the conventional apparatus by decreasing the differences of dishing ratio in the upper, middle, and lower pockets of the susceptor.

The inventors have experimentally ascertained that in the lateral wall portions R of the bell jar 21 that confront the substrates on the susceptor 22 as illustrated in FIG. 9, a linear relation exists between the gap area between the peripheral surface of the susceptor 22 and the internal wall surface of the bell jar 21 (the area enclosed with the polygon forming the periphery of the susceptor and the circle forming the internal wall of the bell jar) and the dishing ratio. From this knowledge, they have derived an idea that the dishing ratios of the upper, middle, and lower levels are equalized by uniformizing the aforementioned gap area in all the positions of the substrates set in place, namely in all the upper, middle, and lower pockets 23, on the susceptor 22. They have continued a study on the basis of this idea and consequently perfected this invention.

BRIEF DESCRIPTION OF THE DRAWINGS

The invention will be better understood and the objects and features thereof other than those set forth above will become apparent when consideration is given to the following detailed description thereof, which makes reference to the accompanying drawings wherein.

DETAILED DESCRIPTION OF THE INVENTION

To be specific, this invention is directed to a cylindrical apparatus for the growth of epitaxial layers having disposed inside a bell jar a susceptor provided thereon with pockets for retaining a substrate, characterized in that the gap area between the peripheral surface of the susceptor and the internal wall surface of the bell jar is equalized at least at any level of the wall portion of the bell jar confronting the substrates on the susceptor.

In other words, this invention contemplates forming the susceptor in the same downwardly expanding shape as that of the conventional apparatus and giving to the bell jar a downwardly increasing inside diameter for the purpose of equalizing the gap area between the periphery of the susceptor and the internal wall surface of the bell jar at any level of the wall portion of the bell jar which confront the substrates on the susceptor.

Though the relation between the gap area defined by the internal wall surface of the bell jar and the peripheral surface of the susceptor and the dishing ratio still remains to be fully elucidated, it is inferred that this dishing ratio bears on the flow rate of the raw material gas inside the bell jar which is fixed by the aforementioned gap area. The stream of the raw material gas inside the bell jar is thought to comprise a constituent flowing downwardly from above plus a constituent flowing in the direction of rotation of the susceptor caused in consequence of the rotation of the susceptor. The latter portion is believed to bear on the dishing ratio.

Specifically, there are indications that the constituent pertinent hereto decreases when the gap area increases in the upper part of the susceptor and the constituent increases when the gap area decreases in the lower part of the susceptor and that the dishing ratio increases in proportion as the constituent of the flow rate of the raw material gas in the direction of rotation increases.

Now, this invention will be described more specifically below with reference to a working example.

Example

Figure 1:
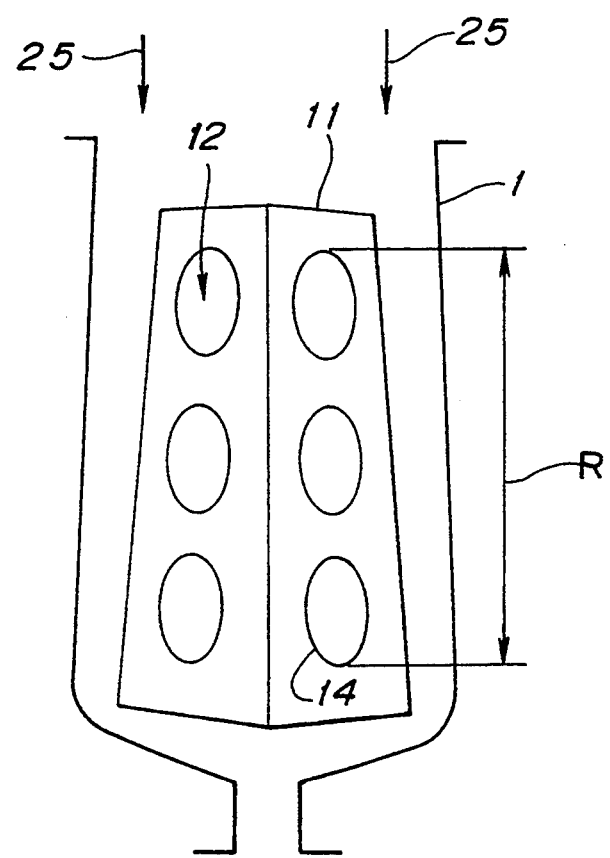
FIG. 1 is a schematic explanatory diagram illustrating one embodiment of this invention.
Figure 2:
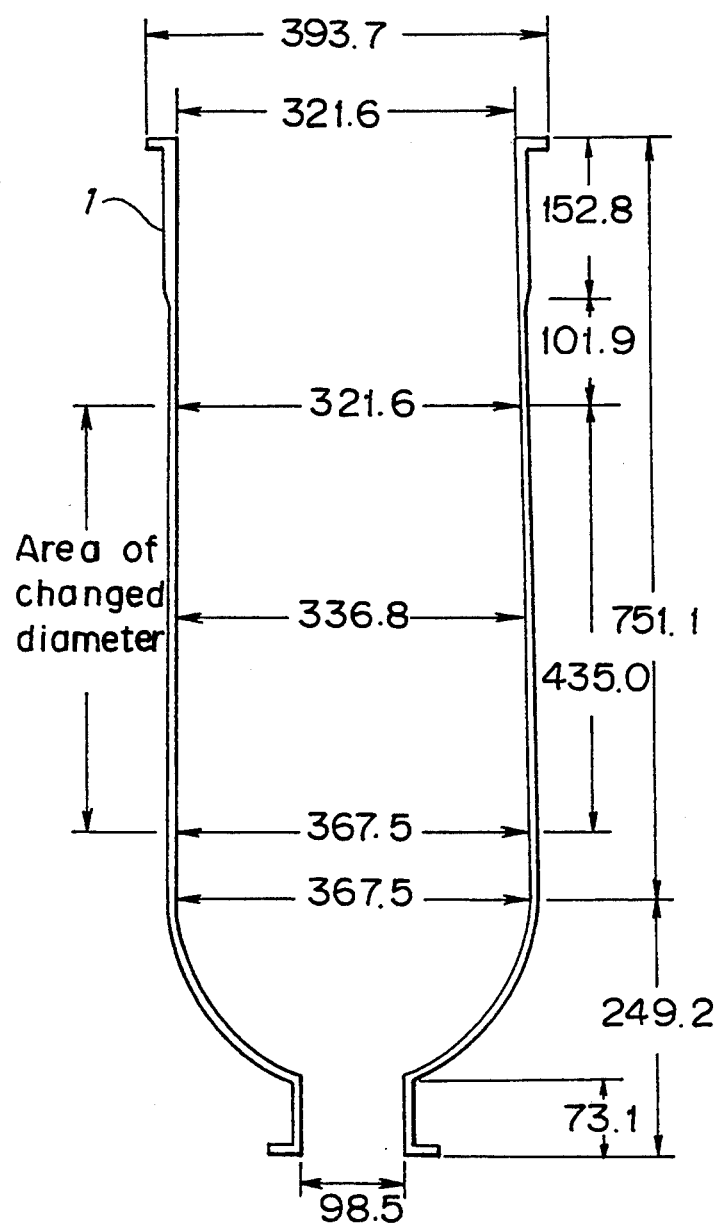
FIG. 2 is a longitudinal cross section illustrating a bell jar found in the embodiment of FIG. 1.

FIG. 1 is a schematic explanatory diagram of a cylindrical apparatus for the growth of epitaxial layers, illustrating the essence of this working example. A bell jar 1 made of quartz is so remodeled as illustrated in FIG. 2 that the internal wall surface of the barrel thereof is formed in the shape of a frustum of a cone in the wall portion of the bell jar confronting the substrates on a susceptor 11. The susceptor 11 is formed in the same three-pocket-sided hexaprismatoidal shape as that in the conventional apparatus. The dimensions of the various parts shown in FIGS. 2 and 3 are indicated in the denomination of "mm." The reference numeral 12 in FIG. 3 represents a pocket.

Figure 5:
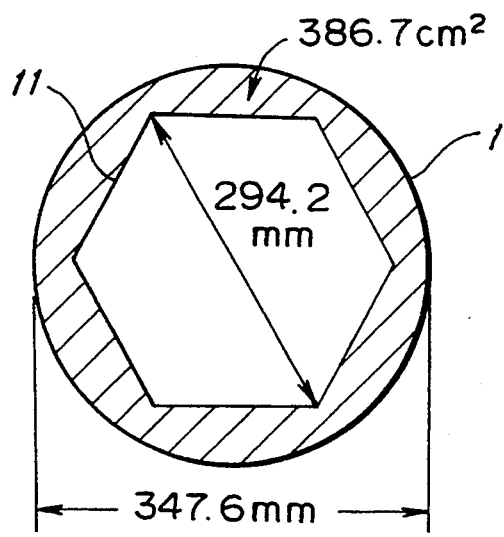
FIG. 5 is a lateral cross section illustrating the gap area between the bell jar and the susceptor in the central positions of the middle pockets.

The gap between the bell jar and the susceptor in the central positions of the middle pockets of the susceptor not yet remodeled possesses such a shape as illustrated in FIG. 5. The area of this gap was 386.7 cm$^2$.

Figure 4:
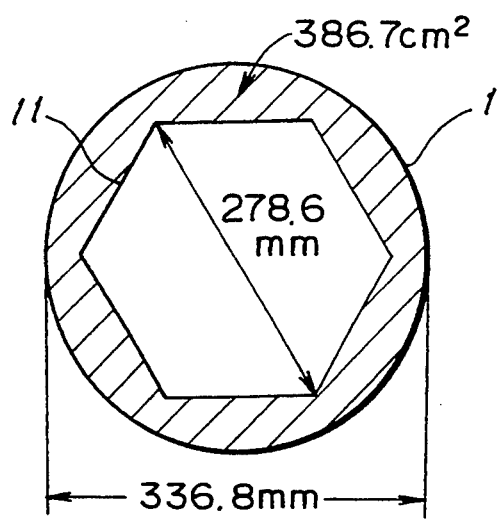
FIG. 4 is a lateral cross section illustrating a gap area between the bell jar and the susceptor in the central positions of the upper pockets.
Figure 6:
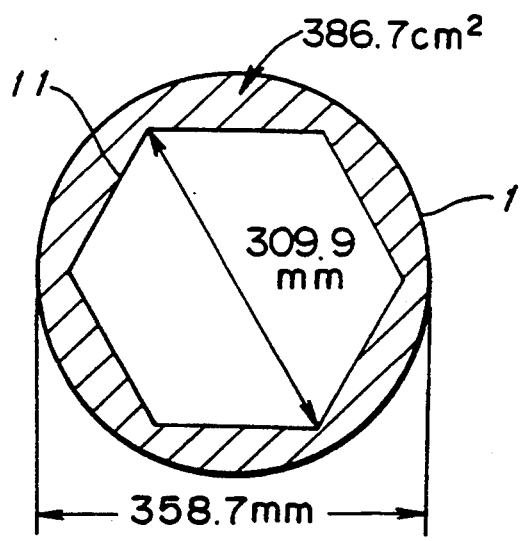
FIG. 6 is a lateral cross section illustrating the gap area between the bell jar and the susceptor in the central positions of the lower pockets.
Figure 7:
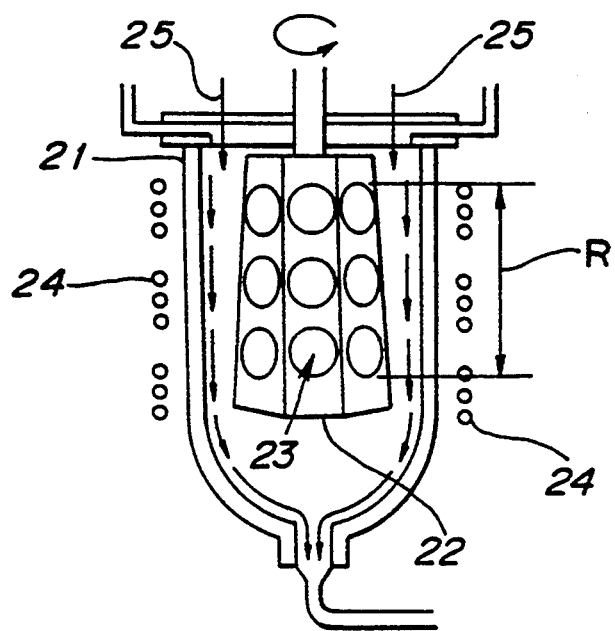
FIG. 7 is a schematic longitudinal cross section illustrating a conventional cylindrical apparatus for the growth of epitaxial layers.
Figure 8:
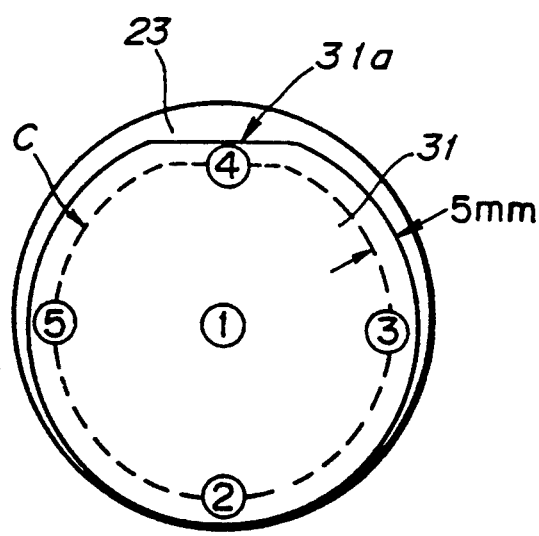
FIG. 8 is an explanatory diagram depicting the procedure for determining the conventional fluctuation of film thickness of an epitaxial layer in the surface of a silicon substrate.
Figure 9:
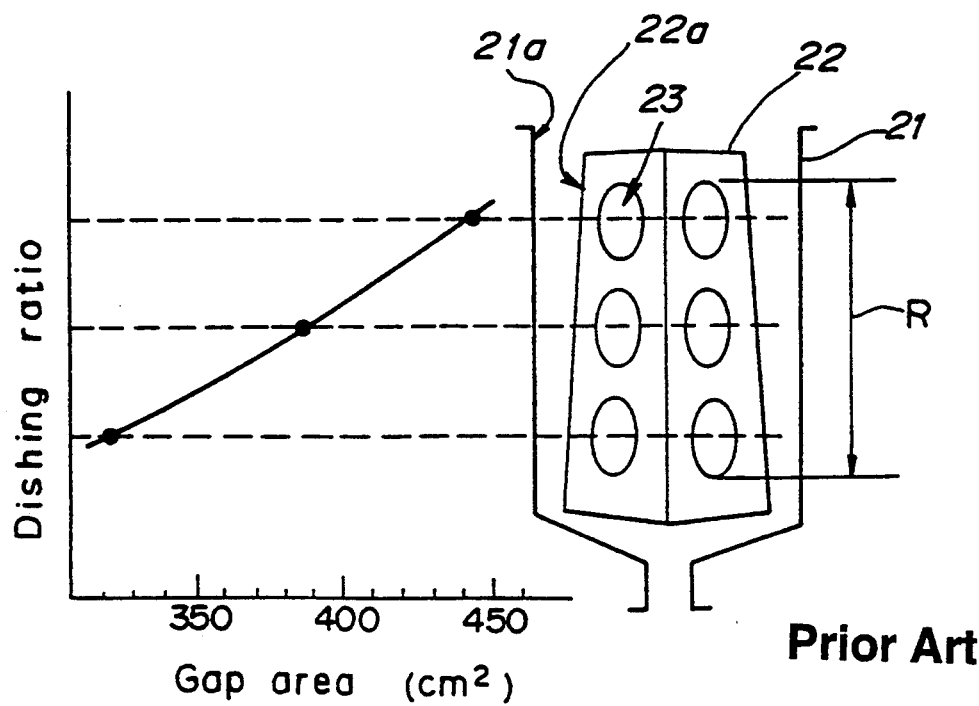
FIG. 9 is a graph showing the relation between the gap area defined by the opposed surfaces of the bell jar and the susceptor in the conventional apparatus of FIG. 7 and the dishing ratio.

The inside diameter of the bell jar 1 at the portion corresponding to the central position of the upper pocket was fixed at 336.8 mm and that at the portion corresponding to the central position of the lower pocket at 358.7 mm as respectively shown in FIG. 4 and FIG. 6 so that the gap area at the central position of the upper pocket and at the central position of the lower pocket respectively of the susceptor would equal that at the central position of the middle pocket thereof. On account of the accuracy of fabrication, the inside diameter of the bell jar 1 was 337.0, 347.5, and 358.5 mm at the portions corresponding to the central positions respectively of the upper, middle, and lower pockets of the susceptor.

Figure 3:
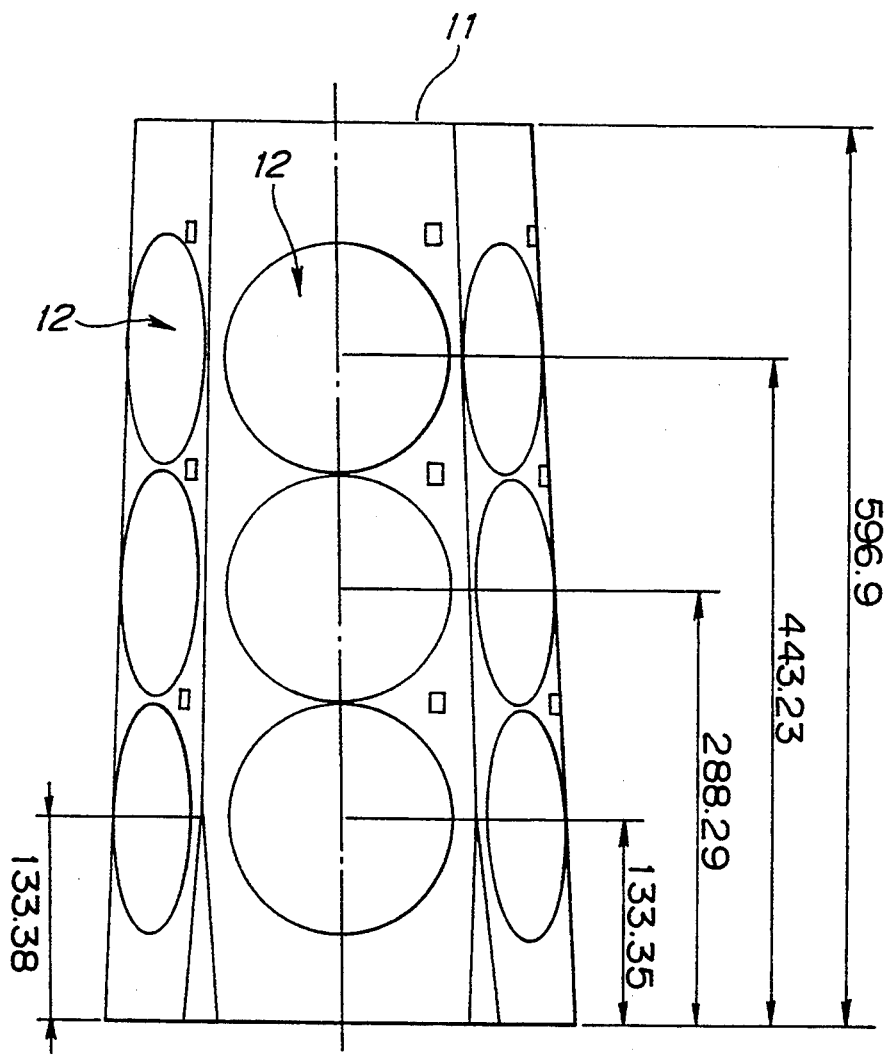
FIG. 3 is a front view illustrating a susceptor found in the embodiment of FIG. 1.

Then, the susceptor 11 of FIG. 3 was so disposed that the upper, middle, and lower pockets were wholly positioned in the "area of changed diameter" shown in FIG. 2 to construct the cylindrical apparatus for the growth of epitaxial layers in the present example.

In the apparatus for epitaxial growth, a total of 18 CZ-high concentration N type <100> silicon single crystal substrates 125 mm in diameter and 600 μm in thickness were set in place on the susceptor 11 and epitaxial layers were grown thereon to 10.0 μm at a rate of 1.0 μm/min at 1130° C. This reaction was performed in two batches. The epitaxial layers formed on the substrates were measured for thickness at five points per substrate by the method described above using a FTIR. In the first batch, the maximum film thickness and the minimum film thickness in the substrate were respectively 3.32% and 1.27% and the fluctuation of film thickness in the batch was 4.03%. On the 18 substrates in the second batch, the maximum film thickness and the minimum film thickness in the substrate were respectively 3.57% and 0.83% and the fluctuation of film thickness in the batch was 4.39%.

It is clearly noted from the description given above that the cylindrical apparatus for the growth of epitaxial layers according with this invention allows the flow rate of a raw material gas inside the apparatus to be rendered uniform, the fluctuation of film thickness of epitaxial layers within one batch to be repressed below 5%, and the fluctuation of film thickness of an epitaxial layer in the substrate to be decreased by equalizing the gap area between the bell jar and the susceptor at all the positions of the substrates set in place on the susceptor.

While there has been shown and described a preferred embodiment of the invention, it is to be distinctly understood that the invention is not limited thereto but may be otherwise variously embodied and practiced within the scope of the following claims.

What is claimed is:

1. A cylindrical apparatus for the growth of epitaxial layers having disposed inside a bell jar a susceptor provided thereon with pockets for retaining a substrate disposed in a plurality of horizontal levels, characterized in that the cross sectional area of a gap lying in a plane normal to the axis of rotation and between a peripheral surface of said susceptor and an internal wall surface of said bell jar is equalized at least at any level of said hell jar confronting the substrates on said susceptor, and wherein said susceptor is formed in the shape of a prismatoid and said bell jar is formed in the shape of a cylinder downwardly enlarged at least in the lateral wall portions of said bell jar confronting the substrates set in place on said susceptor.

2. A cylindrical apparatus for the growth of epitaxial layers having disposed inside a bell jar a susceptor provided thereon with pockets for retaining a substrate disposed in a plurality of horizontal levels, characterized in that the cross sectional area of a gap lying in a plane normal to the axis of rotation and between a peripheral surface of said susceptor and an internal wall surface of said bell jar is equalized at least at any level of said bell jar confronting the substrates on said susceptor, and wherein an angle between a centerline of said susceptor and a surface of said susceptor lying in a plane which contains said centerline is greater than an angle between said centerline and the internal wall surface of said bell jar lying in said plane.

* * * * *